United States Patent
Huang et al.

[11] Patent Number: 6,037,222
[45] Date of Patent: Mar. 14, 2000

[54] METHOD FOR FABRICATING A DUAL-GATE DIELECTRIC MODULE FOR MEMORY EMBEDDED LOGIC USING SALICIDE TECHNOLOGY AND POLYCIDE TECHNOLOGY

[75] Inventors: Kuo Ching Huang, Kaohsiung; Tse-Liang Ying, Hsin-Chu; Chen-Jong Wang, Hsin-Chu; Jenn Ming Huang, Hsin-Chu, all of Taiwan

[73] Assignee: Taiwan Semiconductor Manufacturing Company, Hsin-Chu, Taiwan

[21] Appl. No.: 09/083,271

[22] Filed: May 22, 1998

[51] Int. Cl.[7] .................. H01L 21/336; H01L 21/8234
[52] U.S. Cl. ........................ 438/257; 438/258; 438/275
[58] Field of Search .................................. 438/257, 258, 438/239, 275, 231; 257/346

[56] References Cited

U.S. PATENT DOCUMENTS

| | | | |
|---|---|---|---|
| 5,057,449 | 10/1991 | Lowery et al. | 437/60 |
| 5,455,444 | 10/1995 | Hsue | 437/49 |
| 5,532,181 | 7/1996 | Takebuchi et al. | 437/43 |
| 5,658,812 | 8/1997 | Araki | 438/258 |
| 5,668,035 | 9/1997 | Fang et al. | 438/239 |
| 5,672,521 | 9/1997 | Barsan et al. | 437/24 |
| 5,834,352 | 11/1998 | Choi | 438/275 |
| 5,897,349 | 4/1999 | Agnello | 438/230 |
| 5,936,279 | 8/1999 | Chuang | 257/346 |

*Primary Examiner*—John F. Niebling
*Assistant Examiner*—Walter L. Lindsay, Jr.
*Attorney, Agent, or Firm*—George O. Saile; Stephen B. Ackerman; William J. Stoffel

[57] ABSTRACT

A method of manufacturing a memory device having embedded logic. The memory and logic FETS have two different two gate oxide 20 34 thicknesses. The method integrates (1) a salicide contact process 72 74 (logic devices) and dual gate (N+/P+) logic gate 24A 24B technology with (2) memory device Polycide with Self aligned Contact 80 Technology. The method comprises:

(a) forming a first gate oxide layer 20, a first polysilicon layer 24, and a first gate cap layer 28 over said logic area 12;

(b) forming memory gate structures 34 36 38 40 42A in memory area 14, (c) forming memory LDD regions 50 adjacent to said memory gate structures 24 26 28 40 in said memory area 14;

(d) patterning said first gate oxide layer 20, said first polysilicon layer 24 and said first gate cap layer 28 over said logic area forming logic gate structures 20 24A & 20 24B;

(e) forming spacers 66;

(f) forming logic Source/drain regions 62;

(g) using a salicide process to form self-aligned silicide logic S/D contacts 72 to said Source/drain regions 62, and to form self-aligned silicide logic gate contacts 74 to said logic gate structures 20 24B & 20 24A; and (h) forming self aligned polycide contacts 80 to said memory source/drain regions 50.

15 Claims, 8 Drawing Sheets

| KEY PROCESSES THAT THE INVENTION INTEGRATES | |
|---|---|
| LOGIC AREA 12 | MEMORY AREA 14 |
| SALICIDE CONTACT PROCESS 72 74 WITH DUAL GATE (N+/P+ GATE 24 INTEGRATES | POLYCIDE WITH SELF ALIGNED WITH SELF ALIGNED CONTACT 80 TECHNOLOGY |
| THIN GATE OXIDE 20 INTEGRATES | THICK GATE OXIDE 34 |

METHOD FOR FABRICATING A DUAL-GATE DIELECTRIC MODULE FOR MEMORY EMBEDDED LOGIC USING SALICIDE TECHNOLOGY AND POLYCIDE TECHNOLOGY

BACKGROUND OF INVENTION

1) Field of the Invention

This invention relates generally to fabrication of integrated circuit devices and more particularly to the fabrication of a memory device having embedded logic and more particularly to a memory device with embedded logic where the memory and logic FETs have different thickness gate oxide layers.

2) Description of the Prior Art

With the advent of Large Scale Integration (LSI) many of the integrated circuits formed on semiconductor substrates are comprised of several circuit functions on a single chip. For example, dynamic random access memory (DRAM), nonvolatile memory (NVM), and similar memory devices are composed of an array of memory cells for storing digital information, while the peripheral circuits on these devices are typically composed of logic circuits for addressing the memory cells. While other peripheral circuits function as read/write buffers and sense amplifiers.

To improve performance and optimize these devices, it is very desirable in the electronics industry to provide FETs that have both thin and thick gate oxides (dielectrics).

Typically, a thin gate oxide (dielectric) is used in the peripheral (logic) circuits to enhance FET device performance, while it is desirable to provide a thicker gate oxide for the higher gate voltage (Vg) requirements on the FET access transistors in the DRAM cells. More generally, there is a need to form devices with transistors having two different gate oxide (Dual gate oxide) thicknesses.

Typically, by the prior art, the dual-gate oxide is formed by thermally growing in the memory cell device area and in the logic device area (peripheral area), a first gate oxide on the substrate. A photoresist mask is then used to mask the gate oxide over the memory cell device area and the gate oxide is etched in the logic device area. The photoresist is then stripped and a second-gate oxide is grown on the logic device area, while the original gate oxide in the memory cell device area increases in thickness. Unfortunately, the inventor has found, by the method of the prior art, the presence of the photoresist over the gate oxide in the memory device area contaminates the oxide and degrades the device electrical characteristics. For example, one such contaminant is the mobile sodium (Na) ion in the gate oxide that can and does affect the long-term stability of the gate voltage (Vg) on the FET.

Therefore, there is still a strong need in the semiconductor industry for providing a thin gate oxide for the logic areas, and a thicker gate oxide for the memory areas without having the photoresist layer come into direct contact with the gate oxide, and by a method that does not substantially increase the manufacturing process complexity or cost.

An embedded Semiconductor Memory can increase bus width without increasing the pin counts of the package. Large bus width gives the embedded Memory an advantage in obtaining higher bandwidth. In the inventor's embedded memory, it is necessary to fabricate different thickness of gate oxide for 5.5V I/O and 3.3V/2.5V internal circuit to reduce power dissipation. There exist one major drawback in current technology for integrate dual gate oxide: Photoresist directly cover on the gate oxide and thus the oxide will be damaged more or less during removing photoresist process.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,672,521 (Barsan) that shows a method of forming multiple gate oxide thicknesses on a wafer substrate that uses doped and nitrogen I/I areas to enhance/retard oxide growth.

U.S. Pat. No. 5,658,812 (Araki) aims to prevent the thickness of the element separation insulating film of the high voltage withstanding area from being thinned and reliability of the memory cell from being reduced. The patent forms photoresist layers over gate oxide regions to protect the regions from etches.

U.S. Pat. No. 5,532,181 (Takebuchi) shows a method of manufacturing semiconductor non-volatile memory device having different gate insulating thicknesses. A semiconductor non-volatile memory device includes a semiconductor substrate, insulating films formed on the semiconductor substrate and having at least two types of gate insulating films having different thicknesses.

U.S. Pat. No. 5,668,035 (Fang) shows a method for fabricating a dual-gate dielectric module for memory with embedded logic technology.

However, the prior art process can be further improved.

SUMMARY OF THE INVENTION

It is an object of the present invention to provide a method for fabricating a thin gate oxide for FETs on Logic areas on a substrate and thick gate oxide layers on Memory regions for an embedded logic device.

It is an object of the present invention to provide a method for fabricating an memory device with embedded logic that integrates (1) a Ti-Salicide process for the logic circuit, and (2) a W polycide, and Self-Alignment Contact process (for the memory area) without increasing process complexity.

It is an object of the present invention to provide a process to perform LDD implant (As+) for logic regions and Phosphorus for memory regions (e.g., DRAM).

It is another object of the invention t integrate salicide technology and polycide with self-align contact technology without increasing the mask layer and process complexity.

It is another object to provide a process for forming both a buried channel and surface channel PMOS on the same chip.

These objects are met by the invention's process for fabricating a semiconductor device having transistors with two different thickness gate oxide layers;. The method forms a memory device having embedded logic. The memory and logic FETs have two different two gate oxide 20 34 thicknesses. The method integrates (1) a salicide contact process 72 74 (logic devices) and dual gate (N+/P+) logic gate 24A 24B technology with (2) memory device Polycide with Self aligned Contact 80 Technology.

The method comprising the steps of
  (a) See FIG. 1—forming isolation areas 18 19 on a substrate 10 surrounding and electrically isolating devices areas 12 14, said device areas 12 14 composed of a logic area 12 and Memory area 14;
  (b) See FIGS. 1 and 2—sequentially forming a first gate oxide layer 20, a first polysilicon layer 24, and a first gate cap layer 28 over said logic area 12;

(c) See FIG. 3—sequentially forming a second gate oxide layer 34, a second polysilicon layer 36, a second polycide layer 38, a second gate cap layer 40, and hard mask layer 42 at least over said memory cell area 14;

(d) See FIG. 4—patterning said second gate oxide layer 34, said second polysilicon layer 36, said second polycide layer 38, said second gate cap layer 40, and said hard mask layer 42 forming memory gate structures 34 36 38 40 42A in memory area 14, and removing said second gate oxide layer 34, said second polysilicon layer 36, said second polycide layer 38, and said second gate cap layer 40 from over said logic area 12;

(e) forming memory LDD regions 50 adjacent to said memory gate structures 24 26 28 40 in said memory area 14;

(f) See FIGS. 5 & 6—patterning said first gate oxide layer 20, said first polysilicon layer 24 and said first gate cap layer 28 over said logic area forming logic gate structures 20 24A 28 & 20 24B 28;

(g) See FIG. 6—forming LDD regions 56 adjacent to said logic gate structures 20 24A 28;

(h) See FIG. 7—removing said first gate cap layer 28;

(i) See FIG. 7—forming spacers 66 on the sidewalls of said logic gate structures 20 24A, said logic gate structures 20 24B and said memory gate structures 34 36 38 40 42A;

(j) See FIG. 7 ion implanting p type ions forming P+ Source/drain regions 62 adjacent the logic p-gate structure 20 24A and doping the logic p-gate structure 20 24A in the logic area 12 and ion implanting n type ions forming N+ source/drain regions 60 adjacent to the logic N-gate structure 20 24B in the logic area 12;

(k) See FIG. 8—forming a resist protection oxide (RPO) layer 68 over said logic gate structure 20 24A & 20 24B and said memory gate structures 34 36 38 40 42A and said substrate;

(l) See FIG. 9—removing said resist protection oxide (RPO) layer 68 from over said logic area 12;

(m) See FIG. 9—using a salicide process to form self-aligned silicide logic S/D contacts 72 to said Source/drain regions 62, and to form self-aligned silicide logic gate contacts 74 to said logic gate structures 20 24B & 20 24A; and (n) See FIG. 9—forming self aligned polycide contacts 80 to said source/drain regions 50 in said memory area 14.

In a preferred embodiment of the invention, both P and N type logic gates 24A and 24B (PMOS and NMOS) are formed in the logic regions. This is call dual gate technology. See FIG. 9.

TABLE

KEY PROCESSES THAT THE INVENTION INTEGRATES

| Logic area 12 | | Memory Area 14 |
|---|---|---|
| Salicide contact process 72 74 with dual gate (N+/P+) gate 24A 24B technology | Integrates | Polycide with Self aligned Contact 80 Technology |
| Thin gate oxide 20 | Integrates | Thick gate oxide 34 |

The main points of the invention area:

1) Photoresist doesn't directly covering the gate oxide 20 in the logic area 12. This improves the quality of the gate oxide. This prevents the gate oxide from suffering damage during the photoresist removal process.

2) Successfully integrate dual gate oxides process (logic and memory areas have gate oxides with different thicknesses) with a cost effective method.

3) Integrate Salicide Technology and Polycide with Self-Alignment Contact (SAC) technology without increasing the mask layer and process complexity.

4) The integration provides the possibility that the buried channel and surface channel PMOS exist in the same chip. The PMOS in memory region is buried channel PMOS (N+ gate and p channel). The PMOS logic region is surface channel (e.g., P+ gate and P-channel).

5) The invention allows us to perform LDD implantation separately for different LDD concentration requirements for DRAM and Logic circuit without increasing the number of masking steps.

6) This invention provides the flexibility to perform the LDD implantation: As+ for logic art device and Phos+ for DRAM cell.

7) This invention provides the flexibility to form dual gates (P+ and N+ gates) in the logic area or single conductivity (P or N) type gates.

8) The invention provides the possibility that the buried channel and surface channel PMOS exist in the same chip. Buried channel has hot carrier issues and mobility increases.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
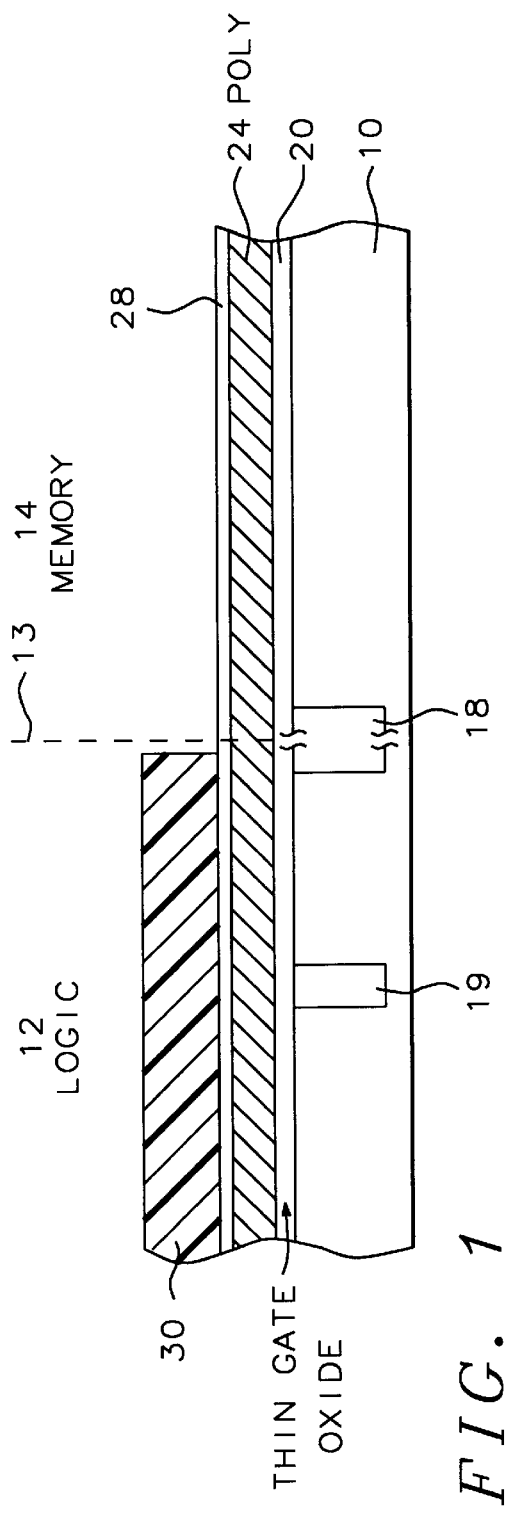
FIGS. 1 through 9 are cross sectional views for illustrating a method for manufacturing an embedded Semiconductor Memory device with a dual gate oxide according to the present invention.

The present invention will be described in detail with reference to the accompanying drawings. The present invention provides a method of forming an embedded Semiconductor Memory device with a dual gate oxide.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

Table of Elements and preferred parameter limits

| number | generic name | alternate names | Important features |
|---|---|---|---|
| 10 | Semiconductor structure | | |
| 12 | Logic area - | first device area | where logic devices are formed. |
| 13 | boundary line | | |
| 14 | memory (e.g., DRAM) area | second device area | where memory device are formed |
| 18 19 | isolation regions | shallow trench isolation (STI) regions | |
| 20 | first gate oxide | | thickness range = 20 to 200 Å |
| 24 | first polysilicon | | un doped and thickness = 500 to 3000 Å |
| 24A | first P gate | Logic P gate polysilicon layer | I/I dose = 1E14 to 1E 16 atoms/cm$^2$ |
| 24B | first N gate | Logic N gate polysilicon layer | I/I dose = 1E14 to 1E 16 atoms/cm$^2$ |
| 28 | first gate cap layer | oxide | thickness = 100 to 200 Å |
| 30 | first gate defining PR layer | logic | |
| 34 | second gate oxide | thick DRAM gate oxide or thick memory gate oxide | thickness = 20 to 200 Å<br>☐ different thickness than first gate oxide 20 (Can be greater then, equal to, or less than) |
| 36 | second polysilicon layer | | thickness range = 500 to 3000 Å |
| 38 | second polycide layer | | thickness range = 500 to 3000 Å |
| 40 | second gate cap layer | buffer oxide layer | thickness range = 100 to 2000 Å |
| 42 | hard mask layer 42 | | silicon nitride or $Si_xN_yO_z$ |
| 42A | Hard mask (for SAC technology) | | silicon nitride or $Si_xN_yO_z$ |
| 34 36 38 40 42A | Memory gate structure | | |
| 46 | memory gate defining photoresist layer 46 | photoresist | |
| 50 | first gate resist layer | logic gate PR layer | |
| 51 | logic gate photo resist layer | | |
| 54 | N LDD in logic area | logic N LDD | I/I dose = 1E12 to 1E14 atom/cm$^2$ |
| 56 | P LDD in logic area | logic P LDD | I/I dose = 1E12 to 1E14 atom/cm$^2$ |
| 60 | (N+) S/D in logic area | logic N+ S/D (can be P or N) | I/I dose = 1E13 to 1E16 atom/cm$^2$ |
| 62 | (P+) S/D in logic areas | logic P+ S/D (can be P or N) | I/I dose = 1E13 to 1E6 atom/cm$^2$ |
| 66 | spacers | spacers | SiN or $SiO_2$ |
| 68 | resist protect oxide (RPO) | | thickness range = 200 to 500 Å |
| 70 | resist layer (photoresist or PR) | | |
| 72 | S/D silicide contacts | in logic area | Ti silicide |
| 74 | gate silicide contacts | in logic area | Ti silicide |
| 24 26 28 40 | memory gate structures | | |
| 20 24A 28 | logic p-gate structure 20 24A 28 | | |
| 20 24B 28 | logic N-gate structure 20 24B 28 | | |

The table below summaries the major steps of the invention including the embodiment for dual gates (N and P logic gates).

TABLE

Summary of the process of the invention

| FIG. | SUMMARY OF THE PROCESS STEPS |
|---|---|
| 1 | forming isolation areas 18 19 on a substrate 10 surrounding and electrically isolating devices areas 12 14, the device areas 12 14 composed of a logic area 12 and Memory area 14; the isolation areas are shallow trench isolation areas; |
| 1 & 2 - | sequentially forming a first gate oxide layer 20, a first polysilicon layer 24, and a first gate cap layer 28 over the logic area 12; |
| 3 | sequentially forming a second gate oxide layer 34, a second polysilicon layer 36, a second polycide layer 38, a second gate cap layer 40, and hard mask layer 42 at least over the memory cell area 14; |
| 4 | patterning the second gate oxide layer 34, the second polysilicon layer 36, the second polycide layer 38, the second gate cap layer 40, and the hard mask layer 42 forming memory gate structures 34 36 38 40 42A in memory area 14, and removing the second gate oxide layer 34, the second polysilicon layer 36, the second polycide layer 38, and the second gate cap layer 40 from over the logic area 12; |

TABLE-continued

Summary of the process of the invention

| FIG. | SUMMARY OF THE PROCESS STEPS |
|---|---|
| | forming memory LDD regions 50 adjacent to the memory gate structures 24 26 28 40 in the memory area 14;<br>*the memory LDD regions 50 are preferably formed by a phosphorous ions ion implant process; |
| 5 & 6 | patterning the first gate oxide layer 20, the first polysilicon layer 24 and the first gate cap layer 28 over the logic area forming a logic p-gate structure 20 24A 28 and a logic N-gate structure 20 24B 28; |
| 6 | forming P LDD regions 56 adjacent to the logic p-gate structure |

TABLE-continued

Summary of the process of the invention

| FIG. | SUMMARY OF THE PROCESS STEPS |
|---|---|
|  | 20 24A 28 and forming N LDD regions 54 adjacent to a logic N-gate structure 20 24B 28; |
| 7 | removing the first gate cap layer 28; |
| 7 | forming spacers 66 on the sidewalls of the logic p-gate structure 20 24A, the logic N-gate structure 20 24B and the memory gate structures 34 36 38 40 42A; |
| 7 | ion implanting p type ions forming P+ Source/drain regions 62 adjacent the logic p-gate structure 20 24A and doping the logic p-gate structure 20 24A in the logic area 12 and ion implanting n type ions forming N+ source/drain regions 60 adjacent to the logic N-gate structure 20 24B in the logic area 12; **the N+ Source/drain regions 60 in the logic area 12 are preferably formed by implanting As ions; |
| 8 | forming a resist protection oxide (RPO) layer 68 over the logic p-gate structure 20 24A, the logic N-gate structure 20 24B and the memory gate structures 34 36 38 40 42A and the substrate; |
| 9 | removing the resist protection oxide (RPO) layer 68 from over the logic area 12; |
| 9 | using a salicide process to form self-aligned silicide logic S/D contacts 72 to the P+ Source/drain regions 62 and to the N+ source/drain regions 60 using the spacers 66, and to form first self-aligned silicide logic gate contacts 74 to the N-gate structure 20 24B and the P-gate logic structures 20 24A; and |
| 9 | forming self aligned polycide contacts 80 to the source/drain regions 50 in the memory area 14. |

The method of concurrent fabrication of fabrication of field effect transistors (FETs) having two gate electrode dielectric layers with different thickness for a memory device having embedded logic begins by providing a Substrate. Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

FIG. 1 shows the formation of isolation areas 18 19 on a substrate 10 surrounding and electrically isolating devices areas 12 14. The device areas 12 14 are composed of a first device area 12 (e.g., logic area) and second device area 14 (e.g. Memory area, or DRAM area). The isolation areas are preferably formed using a shallow trench isolation (STI) process.

FIG. 1 illustrates the step of sequentially forming a first thin gate oxide layer 20, a first undoped polysilicon layer 24, and a first gate cap layer 28 over at least the first device area 12 (e.g., logic area).

The first thin gate oxide layer 20 (logic gate oxide) preferably has a thickness in a range of between about 20 and 200 Å.

FIG. 1 also displays the step of forming a first gate defining photoresist layer 30 over the logic area 12. The photoresist layer 30 is used as an etch mask.

Figure 2:
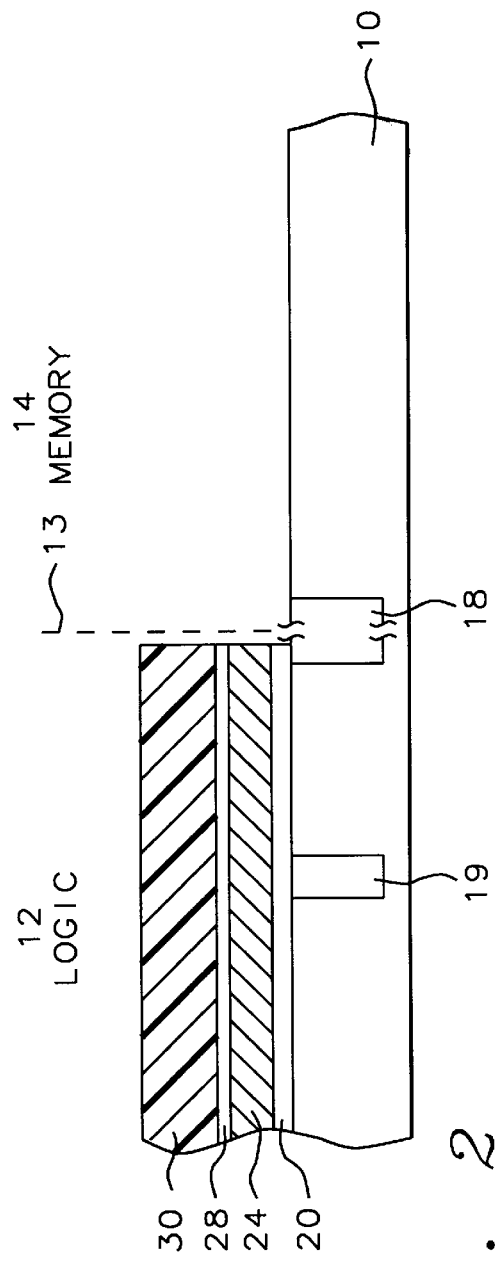

FIG. 2 shows the removal of the first thin gate oxide layer 20, the first polysilicon layer 24, and the first gate cap layer 28 over second device area 14 (Memory area 14).

Figure 3:
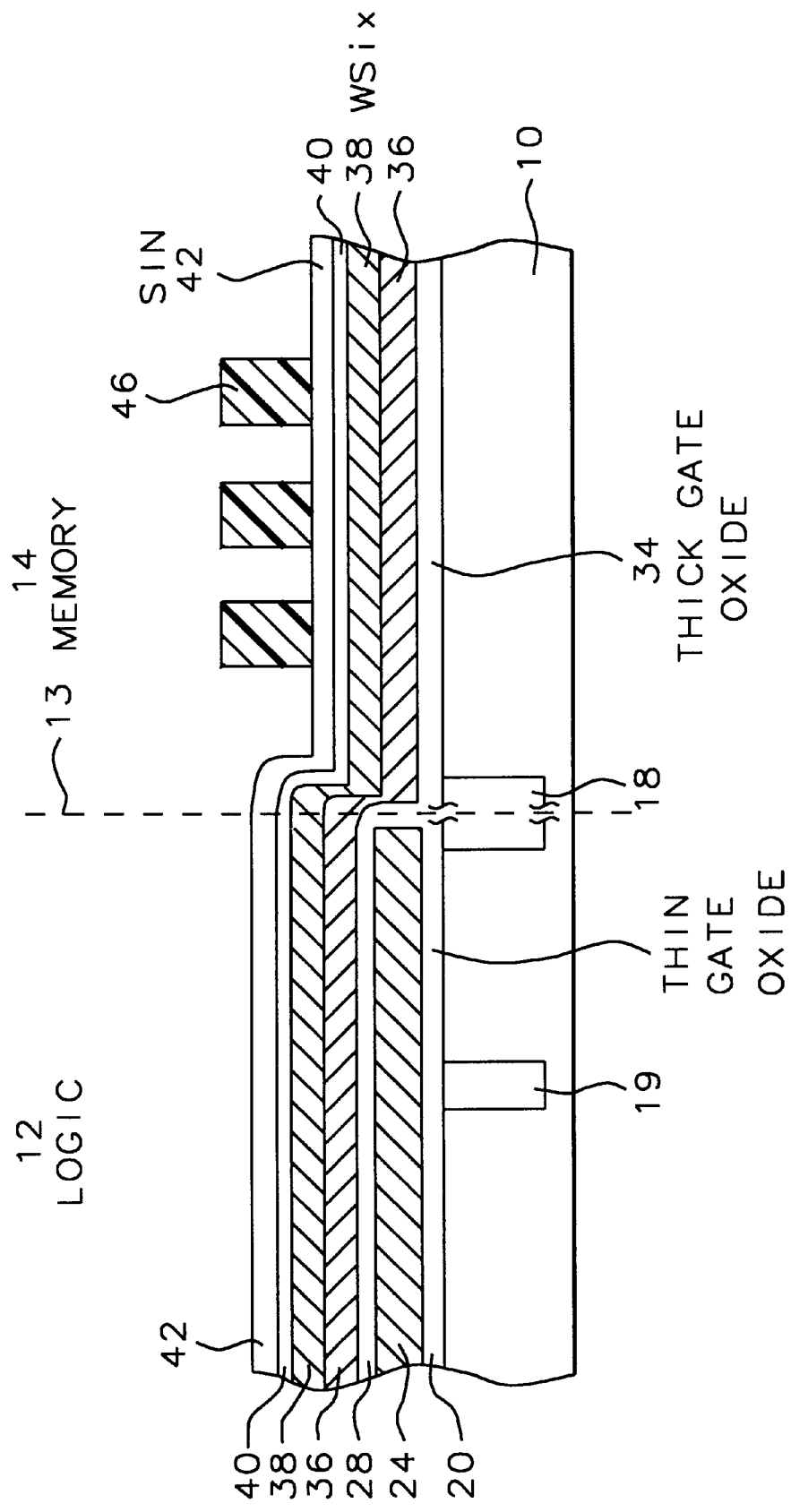

FIG. 3 shows sequentially forming a second thick gate oxide layer 34, a second polysilicon layer 36 a second polycide layer 38, a second gate cap layer (buffer oxide layer) 40, hard mask layer 42 and a masking layer (memory gate defining photoresist layer 46) 46 at least over the second device area 14 (memory cell area 14). The second polysilicon layer 36 is preferably a N+ doped polysilicon layer. The second gate oxide layer is preferably thicker than the first thin gate oxide layer, but in certain applications the first gate oxide can be thicker than the second gate oxide layer.

TABLE

| Layer | Parameter | Low | High |
|---|---|---|---|
| a second thick gate oxide layer 34, | thickness | 20Å | 200Å |
| a second polysilicon layer 36 | thickness | 500 Å | 3000 Å |
| a second polycide layer 38 | Material - W, WSi$_x$ |  |  |
|  | thickness | 500 Å | 3000Å |
| a second gate cap layer (buffer oxide layer) 40, | thickness | 100 Å | 2000 Å |
| hard mask layer 42 (hard mask for SAC) | material - Silicon Nitride |  |  |

Figure 4:
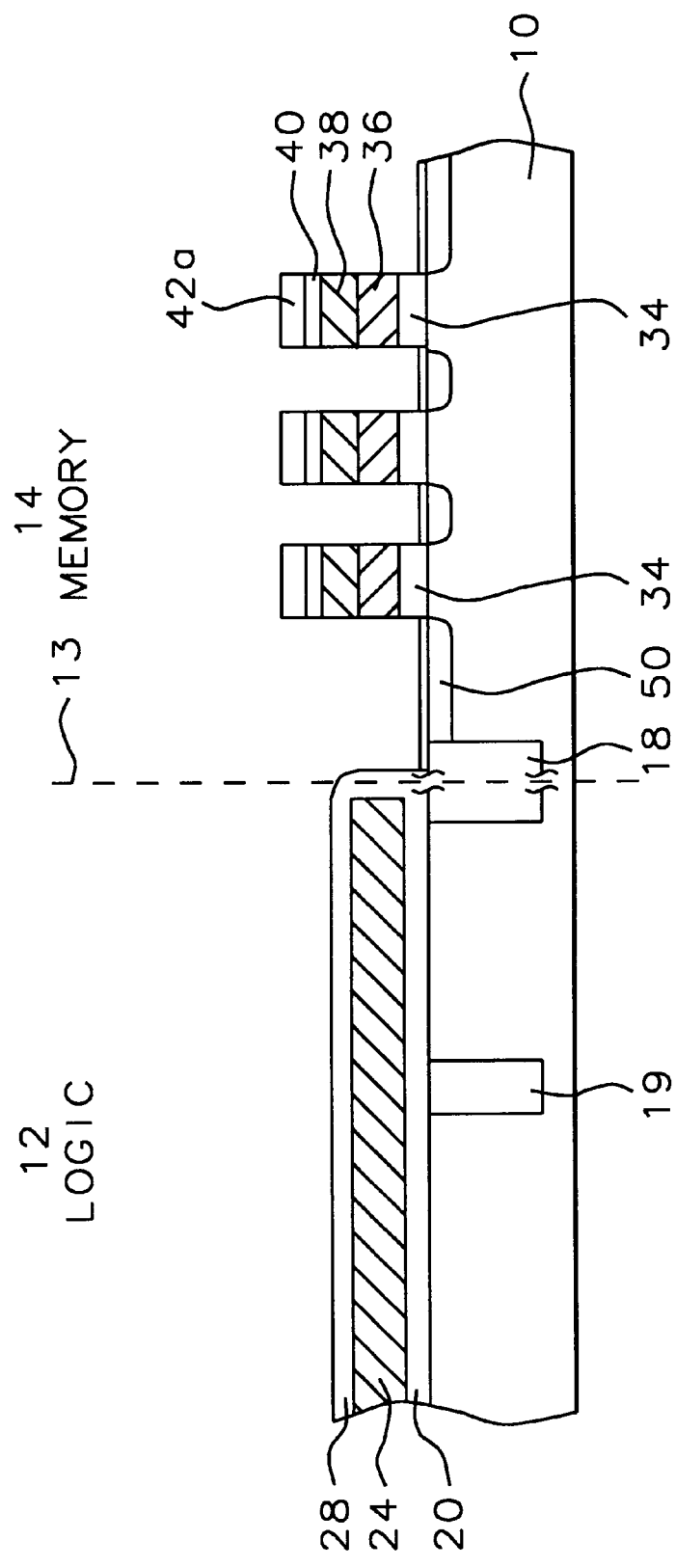

FIG. 4 shows the patterning (e.g., etching) the second gate oxide layer 34, the second polysilicon layer, the second polycide layer 38, the second gate cap layer 40, and the hard mask layer 42 using the masking layer 46 as an etch mask. This forms memory gate structures 34 36 38 40 42A in the second device area 14 (memory cell area 14). The hard mask layer 42 is patterned to form a hard mask 42A that is used in the self aligned Contact technology process.

Also, the second gate oxide layer 34, the second polysilicon layer, the second polycide layer 38, the second gate cap layer 40, and the masking layer over the first device area 12 (logic cell area 12) are removed by the etch process using a photoresist masking layer 46. The memory gate defining photoresist layer 46 is removed.

Next, an ion implant is performed to form the memory LDD 50 (lightly doped source and drains) in the memory area 14. See FIG. 4. Preferably, the LDD 50 in the memory area 14 is formed by implanting Phosphorous ions (Phos+).

Figure 5:
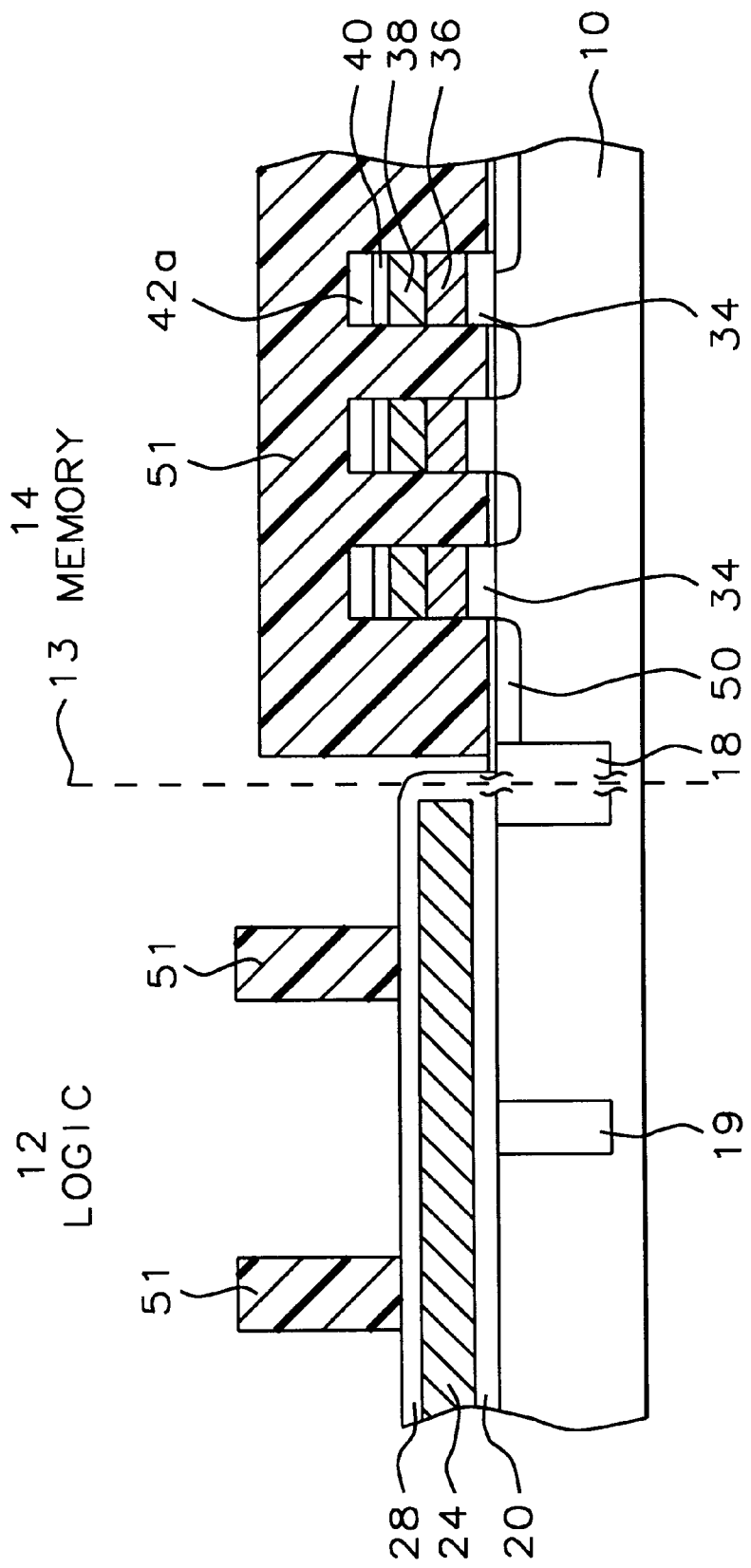
Figure 6:
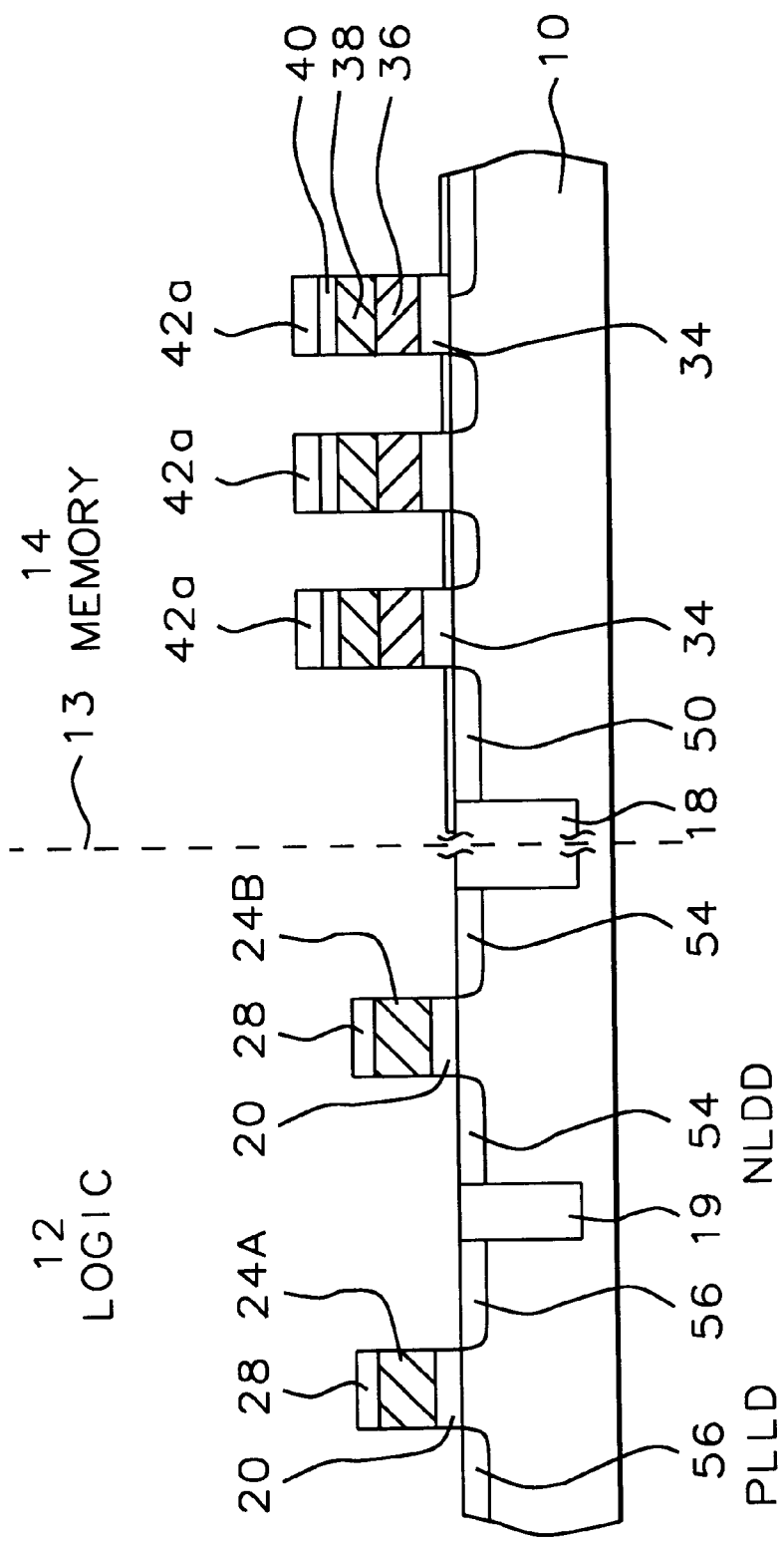

FIGS. 5 & 6—Forming Logic P-Gate & N-Gate Structures 20 24a 24b 28

FIG. 5 shows the formation of a logic gate photo resist layer 51 having openings over the logic area 12 to define the logic gates and covering the surface over the memory area 14. The logic gates 28 24A 24B 20 are defined using an etch.

FIG. 6 shows the patterning the first gate oxide layer 20, the first polysilicon layer 24 and the first gate cap layer 28 over the first device area 12 (logic area) forming a logic p-gate structure 20 24A 28 and a logic N-gate structure 20 24B 28. At this point in the process, the conductive layer 24A 24B is undoped.

FIG. 6—Forming P LDD Regions 56 And N LDD Regions 54 In The Logic Area

FIG. 6 shows the formation of P LDD regions 56 and N LDD regions 45. The P LDD and N LDD can be formed in any order. The P LDD regions 56 adjacent to the logic p-gate structure 20 24A 28. The P LDD regions 56 are formed using an implant process.

N LDD regions 54 are formed adjacent to a logic N-gate structure 20 24B 28 preferably using an implant process.

The gates 24A 24B 40 are protected from being implanted by a photoresist during the LDD processes.

Alternately, the LDD regions 54 56 can be formed of one impurity type (e.g., both N or both P type). These depends whether both NMOS and PMOS FETs or just NMOS or PMOS devices are formed in the logic area 12.

Figure 7:
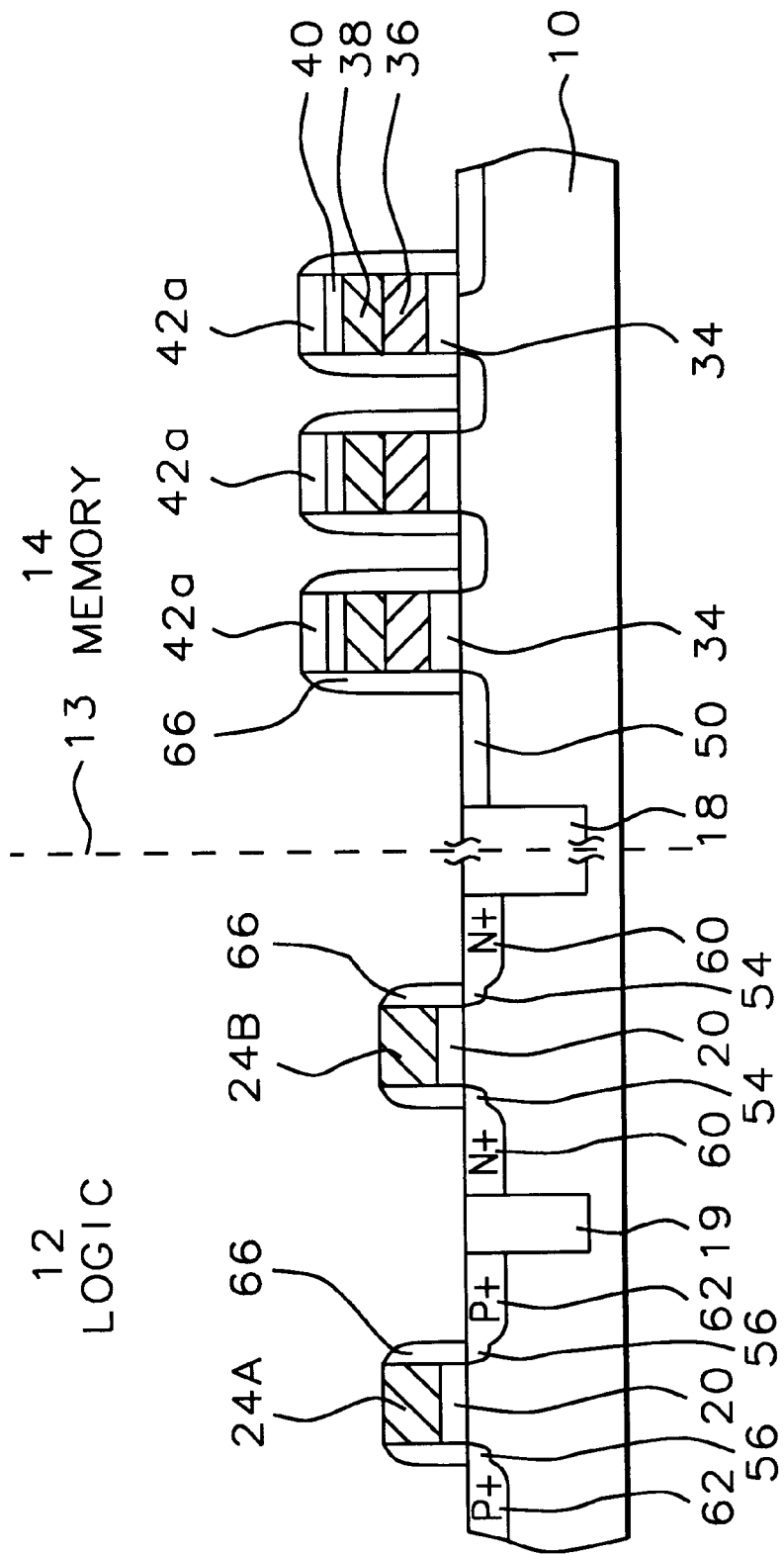

FIG. 7 shows the removal of the first gate cap layer 28.

FIG. 7 illustrates the formation of spacers 66 on the sidewalls of the logic p-gate structure 20 24A 28, the logic N-gate structure 20 24B 28 and the memory gate structures 34 36 38 40 42A. The spacers 66 are preferably composed of silicon nitride (SiN).

FIG. 7—Forming Dual Gates (P+ And N+ Gates) In The Logic Area 12

FIG. 7 shows the formation of Dual gates (P+ and N+ gates) in the logic area and the formation of P+ and N+ S Source/Drain (S/D) regions 62 60. FIG. 7 illustrates forming P+ Source/drain regions 62 adjacent the P-gate structures 24A and forming N+ source/drain regions 60 adjacent the N-gate structures 24B using the spacers 66 as an implant mask. FIG. 7 shows the formation of Dual gates (P+ and N+ gates). Preferably, the N+ S/D regions are formed using a Arsenic ion implant.

The process for doping the gates can be performed by doping the gate 24a and 24B with P and N dopants.

Photoresist layers are formed over the surface to protect the gates and other surface from unwanted the P and N implants. For example, during a N-type ion implant (That dopes the N+ S/D 60 and the N+ gate 24B), a photoresist layer (not shown) covers and prevents the PMOS regions (e.g., gate 24A, LDD 50, S/D 62) from being implanted. Likewise, during a P-type implant (that dopes the P+ gate 24A, P+ S/D 62), a photoresist layer (not shown) covers and prevents the NMOS areas (e.g., gate 24B, LDD 54, S/D 60) from P-type impurities. The dual gate formation (N+ and P+ gates) 24A 24B is an optional embodiment. The gates can be formed of one impurity type (all logic devices PMOS or NMOS).

The invention can also form logic gates of only one type (P+ or N+). In this alternative embodiment, the gates 24A and 24B would be of the same type impurity. The process of the invention can be can be performed with either P+ or N+ logic gates (PMOS or NMOS devices).

In addition, S/D (Source /drain) regions (not shown) can be formed in the memory area 14 using a photoresist layer and an ion implant process. This is an optional process that can be performed at this point in the process or later but before the contacts 80 are formed. (See FIG. 9).

Figure 8:
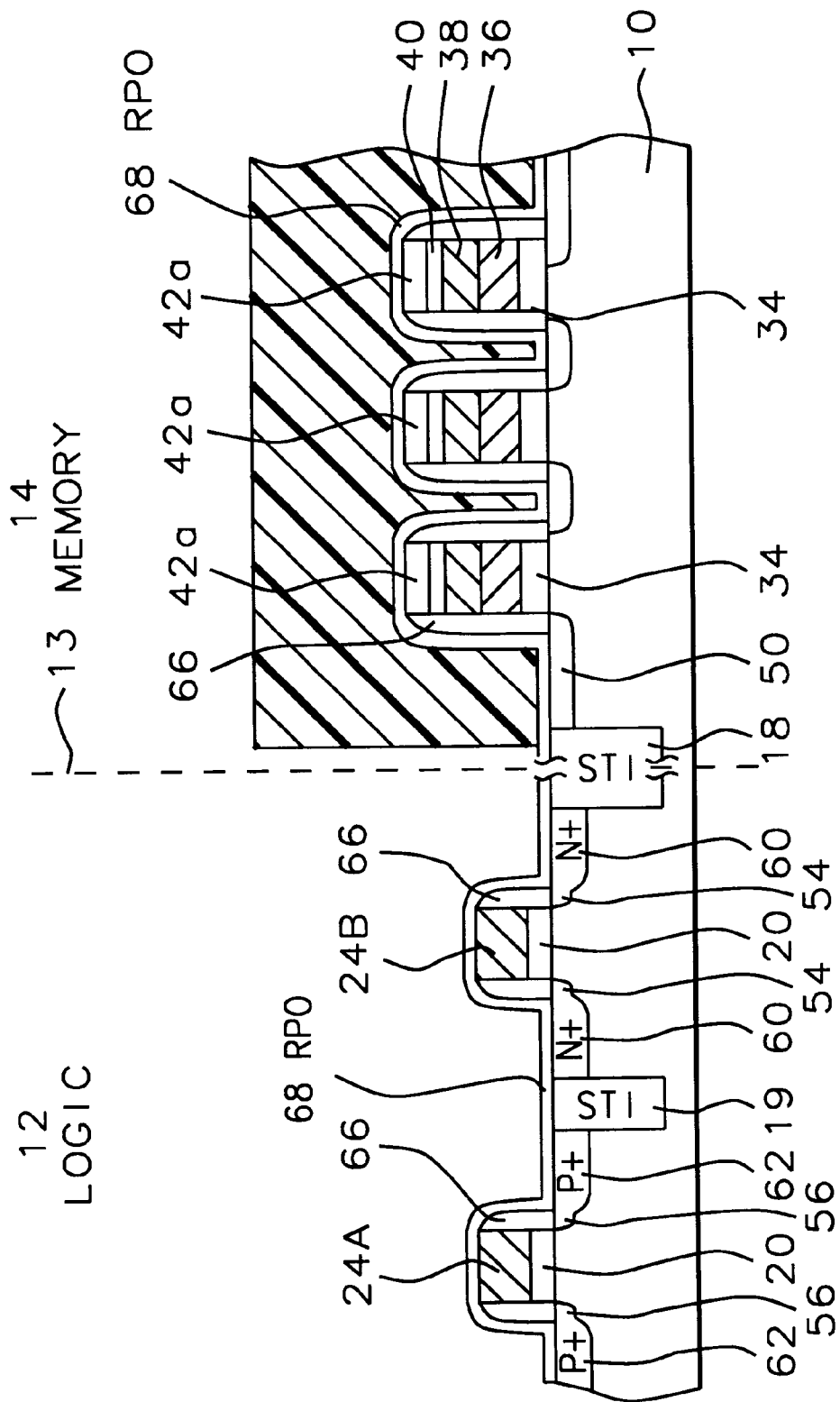

FIG. 8 shows forming a resist protection oxide (RPO) layer 68 over the logic p-gate structure 20 24A 28, the logic N-gate structure 20 24B 28 and the memory gate structures 34 36 38 40 42A and the substrate. The RPO layer is preferably composed of silicon oxide. FIG. 8 shows the RPO photoresist layer 70 covering the memory area 14.

Figures 9, 10:
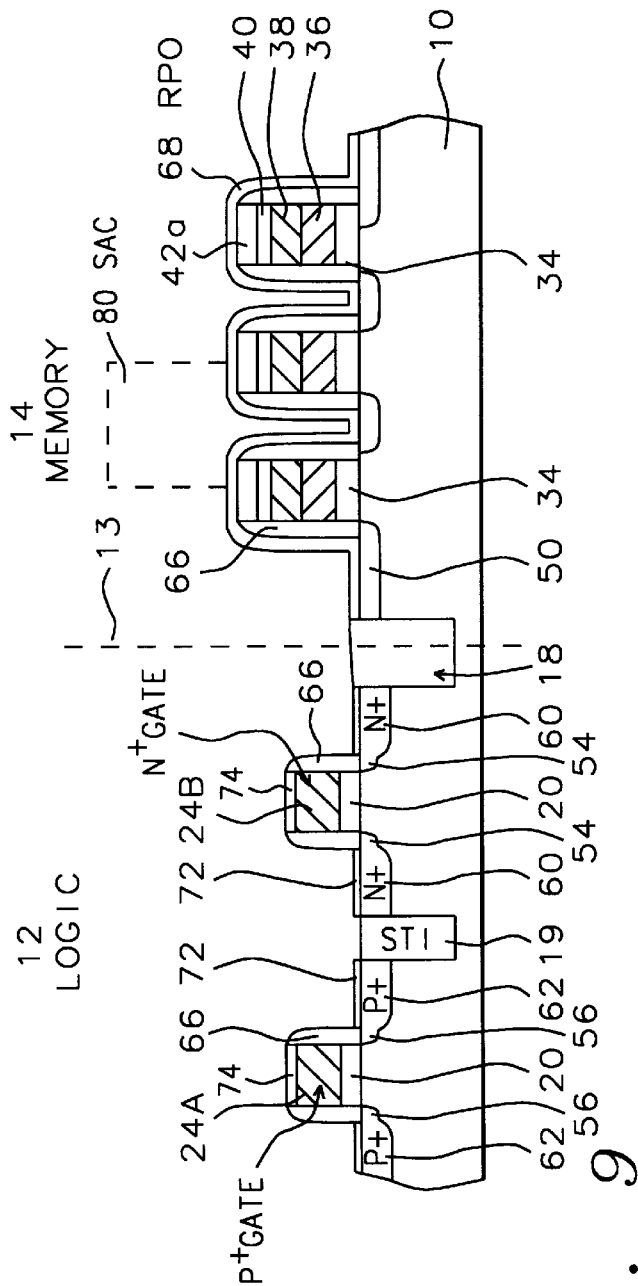
FIG. 10 is a table explaining the processes shown in FIG. 9 that the invention integrates.

FIG. 9 shows the etch removal of the resist protection oxide (RPO) layer 68 from over the logic area 12. The RPO layer 68 prevents Silicide from forming on the S/D 50 in the Memory area 14 during a subsequent silicide formation step. (See FIG. 9 for the salicide process in the logic area 12).

FIG. 9—Salicide Contacts In Logic Area And Polycide Contacts In Memory Area

FIG. 9 shows forming first (Salicide)self-aligned silicide (logic) S/D contacts 72 to the P+ Source/drain regions 62 and the N+ source/drain regions 60 using the spacers 66, and forming first self-aligned gate silicide (logic) contacts 74 to the N-gate structure 20 24B and the P gate structures 20 24A. Salicide contacts are self aligned silicide contacts where a metal layer is formed over the surface structure (e.g., silicon S/D areas, the silicon gate top and sidewall spacer 66) and annealed. Salicide (Self aligned silicide) contacts 72 74 are formed on the exposed silicon S/d and Gate surfaces 24A 24B and not on the sidewall spacers 66 and other non-silicon surfaces.

The contact 72 are preferably composed of Ti silicide or Cobalt silicide. The Ti Silicide is formed by depositing a Ti layer and rapid thermal annealing the Ti layer to react with the Si substrate to from TiSix (Ti—silicide).

FIG. 9 also shows the formation of self aligned Contact (SAC) 80 in the memory area 14. This Self aligned contact 80 is preferably formed using a polycide process.

ADVANTAGES OF THE INVENTION

The invention provides the following advantages:

Photoresist doesn't directly cover the gate oxide 20 in the logic area 12 when removing the gate oxide over the Memory area 14. See FIG. 1. The inventor has found that this improves the quality of the gate oxide 20. This prevents the gate oxide from suffering damage during the photoresist removal process.

Successfully integrate dual gate oxides process (logic and memory areas have gate oxides with different thicknesses) with a cost effective method.

Integrate Salicide Technology and Polycide with Self-Alignment Contact (SAC) technology without increasing the mask layer and process complexity.

The integration provides the possibility that the buried channel and surface channel PMOS exist in the same chip. The PMOS in memory region is buried channel PMOS (N+ gate and p channel). The PMOS logic region is surface channel (e.g., P+ gate and P-channel).

The invention allows us to perform LDD implantation separately for different LDD concentration requirements for DRAM and Logic circuit without increasing the number of masking steps.

This invention provides the flexibility to perform the LDD implantation: As+ for logic area 12 devices and Phos+ for DRAM cell 14.

This invention provides the flexibility to form dual gates (P+ and N+ gates) in the logic area or single conductivity (P or N) type gates.

The invention provides the possibility that the buried channel and surface channel PMOS exist in the same chip. Buried channel has hot carrier issues and mobility increases.

TABLE

| KEY PROCESSES THAT THE INVENTION INTEGRATES See FIG. 9 | | |
|---|---|---|
| Logic area 12 | | Memory Area 14 |
| Salicide contact process 72 74 with dual gate (N+/P+) gate 24A 24B technology | Integrates | Polycide with Self aligned Contact 80 Technology |
| Thin gate oxide 20 | Integrates | Thick gate oxide 34 |

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a semiconductor device having transistors with two different thickness gate oxide layers; comprising the steps of:

(a) forming isolation areas on a substrate surrounding and electrically isolating device areas, said device areas composed of a logic area and Memory area;

(b) sequentially forming a first gate oxide layer, a first polysilicon layer, and a first gate cap layer over said logic area;

(c) sequentially forming a second gate oxide layer, a second polysilicon layer, a second polycide layer, a second gate cap layer, and hard mask layer at least over said memory cell area;

(d) patterning said second gate oxide layer, said second polysilicon layer, said second polycide layer, said second gate cap layer, and said hard mask layer forming memory gate structures in memory area, and removing said second gate oxide layer, said second polysilicon layer, said second polycide layer, and said second gate cap layer from over said logic area;

(e) forming memory LDD regions adjacent to said memory gate structures in said memory area;

(f) patterning said first gate oxide layer, said first polysilicon layer and said first gate cap layer over said logic area forming logic gate structures;

(g) forming LDD regions adjacent to said logic gate structures;

(h) removing said first gate cap layer;

(i) forming spacers on the sidewalls of said logic gate structures, said logic gate structures and said memory gate structures;

(j) ion implanting n type ions forming Source/drain regions adjacent said logic gate structures and doping said logic gate structures in said logic area;

(k) forming a resist protection oxide layer over said logic gate structure and said memory gate structures and said substrate;

(l) removing said resist protection oxide layer from over said logic area;

(m) using a salicide process to form self-aligned silicide logic S/D contacts to said Source/drain regions, and to form self-aligned silicide logic gate contacts to said logic gate structures; and (n) forming self aligned polycide contacts to said source/drain regions in said memory area.

2. The method of claim 1 wherein said isolation areas are shallow trench isolation areas.

3. The method of claim 1 wherein said first gate oxide layer has a thickness in a range of between about 20 and 200 Å; said second gate oxide layer has a thickness in a range of between about 20 and 200 Å; and said second gate oxide layer has a greater thickness than said first gate oxide layer.

4. The method of claim 1 wherein said second gate cap layer composed of silicon oxide having a thickness in a range of between about 100 and 2000 Å.

5. The method of claim 1 wherein said second polycide layer is composed of a material selected from the group consisting of tungsten silicide and W polycide.

6. The method of claim 1 wherein said memory LDD regions are formed by a phosphorous ions ion implant process; and said Source/drain regions in said logic area are formed by implanting As ions.

7. The method of claim 1 wherein said logic gate structures are a combination of NMOS devices and PMOS devices.

8. The method of claim 1 wherein said spacers composed of silicon nitride.

9. A method for fabricating a semiconductor device having transistors with two different thickness gate oxide layers; comprising the steps of:

(a) forming isolation areas on a substrate surrounding and electrically isolating device areas, said device areas composed of a logic area and Memory area;

(b) sequentially forming a first gate oxide layer, a first polysilicon layer, and a first gate cap layer over said logic area;

(c) sequentially forming a second gate oxide layer, a second polysilicon layer, a second polycide layer, a second gate cap layer, and hard mask layer at least over said memory cell area;

(d) patterning said second gate oxide layer, said second polysilicon layer, said second polycide layer, said second gate cap layer, and said hard mask layer forming memory gate structures in memory area, and removing said second gate oxide layer, said second polysilicon layer, said second polycide layer, and said second gate cap layer from over said logic area;

(e) forming memory LDD regions adjacent to said memory gate structures in said memory area;

(f) patterning said first gate oxide layer, said first polysilicon layer and said first gate cap layer over said logic area forming a logic p-gate structure and a logic N-gate structure;

(g) forming P LDD regions adjacent to said logic p-gate structure and forming N LDD regions adjacent to a logic N-gate structure;

(h) removing said first gate cap layer;

(i) forming spacers on the sidewalls of said logic p-gate structure, said logic N-gate structure and said memory gate structures;

(j) ion implanting p type ions forming P+ Source/drain regions adjacent said logic p-gate structure and doping said logic p-gate structure in said logic area and ion implanting n type ions forming N+ source/drain regions adjacent to said logic N-gate structure in said logic area;

(k) forming a resist protection oxide layer over said logic p-gate structure, said logic N-gate structure and said memory gate structures and said substrate;

(l) removing said resist protection oxide layer from over said logic area;

(m) using a salicide process to form self-aligned silicide logic S/D contacts to said P+ Source/drain regions and to said N+ source/drain regions using said spacers, and to form first self-aligned silicide logic gate contacts to said N-gate structure and said P-gate logic structures; and (n) forming self aligned polycide contacts to said source/drain regions in said memory area.

10. The method of claim 9 wherein said isolation areas are shallow trench isolation areas.

11. The method of claim 9 wherein said first gate oxide layer has a thickness in a range of between about 20 and 200 Å; said second gate oxide layer has a thickness in a range of between about 20 and 200 Å and said second gate oxide layer has a greater thickness than said first gate oxide layer.

12. The method of claim 9 wherein said memory LDD regions are formed by a phosphorous ions ion implant process; and said N+ Source/drain regions in said logic area are formed by implanting As ions.

13. The method of claim 9 wherein said logic p-gate structure and a logic N-gate structure are NMOS devices.

14. The method of claim 9 wherein said logic p-gate structure and a logic N-gate structure are PMOS devices.

15. A method for fabricating a semiconductor device having transistors with two different thickness gate oxide layers; comprising the steps of:
  (a) forming isolation areas on a substrate surrounding and electrically isolating device areas, said device areas composed of a logic area and Memory area; said isolation areas are shallow trench isolation areas;
  (b) sequentially forming a first gate oxide layer, a first polysilicon layer, and a first gate cap layer over said logic area;
    (1) said first gate oxide layer has a thickness in a range of between about 20 and 200 Å;
  (c) sequentially forming a second gate oxide layer, a second polysilicon layer, a second polycide layer, a second gate cap layer, and hard mask layer at least over said memory cell area;
    (1) said second gate oxide layer has a greater thickness than said first gate oxide layer;
    (2) said second gate oxide layer has a thickness in a range of between about 20 and 200 Å;
    (3) said second gate cap layer composed of silicon oxide having a thickness in a range of between about 100 and 2000 Å;
  (d) patterning said second gate oxide layer, said second polysilicon layer, said second polycide layer, said second gate cap layer, and said hard mask layer forming memory gate structures in memory area, and removing said second gate oxide layer, said second polysilicon layer, said second polycide layer, and said second gate cap layer from over said logic area;
    (1) said second polycide layer is composed of W polycide;
  (e) forming memory LDD regions adjacent to said memory gate structures in said memory area;
    (1) said memory LDD regions are formed by a phosphorous ions ion implant process;
  (f) patterning said first gate oxide layer, said first polysilicon layer and said first gate cap layer over said logic area forming a logic p-gate structure and a logic N-gate structure;
    (1) said logic p-gate structure and a logic N-gate structure are NMOS devices;
    (2) said logic p-gate structure and a logic N-gate structure are PMOS devices;
  (g) forming P LDD regions adjacent to said logic p-gate structure and forming N LDD regions adjacent to a logic N-gate structure;
  (h) removing said first gate cap layer;
  (i) forming spacers on the sidewalls of said logic p-gate structure, said logic N-gate structure and said memory gate structures;
    (1) said spacers composed of silicon nitride;
  (j) ion implanting p type ions forming P+ Source/drain regions adjacent said logic p-gate structure and doping said logic p-gate structure in said logic area and ion implanting n type ions forming N+ source/drain regions adjacent to said logic N-gate structure in said logic area;
    (1) said N+ Source/drain regions in said logic area are formed by implanting As ions;
  (k) forming a resist protection oxide layer over said logic p-gate structure, said logic N-gate structure and said memory gate structures and said substrate;
  (l) removing said resist protection oxide layer from over said logic area;
  (m) using a salicide process to form self-aligned silicide logic S/D contacts to said P+ Source/drain regions and to said N+ source/drain regions using said spacers, and to form first self-aligned silicide logic gate contacts to said N-gate structure and said P-gate logic structures; and
  (n) forming self aligned polycide contacts to said source/drain regions in said memory area.

* * * * *